(12) United States Patent
Lee et al.

(10) Patent No.: US 9,972,378 B2
(45) Date of Patent: May 15, 2018

(54) BASE CHIP AND SEMICONDUCTOR PACKAGE INCLUDING THE SAME

(71) Applicant: SK hynix Inc., Gyeonggi-do (KR)

(72) Inventors: Hyun-Sung Lee, Gyeonggi-do (KR); Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 170 days.

(21) Appl. No.: 15/171,572

(22) Filed: Jun. 2, 2016

(65) Prior Publication Data

US 2017/0178715 A1    Jun. 22, 2017

(30) Foreign Application Priority Data

Dec. 18, 2015 (KR) .......................... 10-2015-0181523

(51) Int. Cl.
*G11C 11/406* (2006.01)
*G11C 11/4076* (2006.01)

(52) U.S. Cl.
CPC .... *G11C 11/40618* (2013.01); *G11C 11/4076* (2013.01)

(58) Field of Classification Search
CPC .............................................. G11C 11/40618
See application file for complete search history.

(56) References Cited

U.S. PATENT DOCUMENTS

2014/0355370 A1* 12/2014 Kim .................. G11C 11/40615
  365/222
2015/0206571 A1* 7/2015 Ko ..................... G11C 11/40618
  365/222
2016/0336060 A1* 11/2016 Shin .................. G11C 11/40607

FOREIGN PATENT DOCUMENTS

| KR | 101003121 | 12/2010 |
| KR | 101175248 | 8/2012 |
| KR | 1020140002182 | 1/2014 |
| KR | 1020140089982 | 7/2014 |

* cited by examiner

*Primary Examiner* — Harry W Byrne
*Assistant Examiner* — R Lance Reidlinger
(74) *Attorney, Agent, or Firm* — IP & T Group LLP

(57) ABSTRACT

A base chip including first to Nth delay units coupled in series, where N is a natural number equal to or larger than 2, wherein when the number of stacked chips over the base chip is 1, the base chip is suitable for delaying a refresh signal, and generating first to Xth delayed refresh signals using the first to Xth delay units among the first to Nth delay units, where X is a natural number having a relation of $N > X \geq 1$, and when the number of stacked chips over the base chip is 2, the base chip is suitable for delaying the refresh signal, and generating first to Yth delayed refresh signals using the first to Yth delay units among the first to Nth delay units, where Y is a natural number having a relation of $N \geq Y > X$.

21 Claims, 12 Drawing Sheets

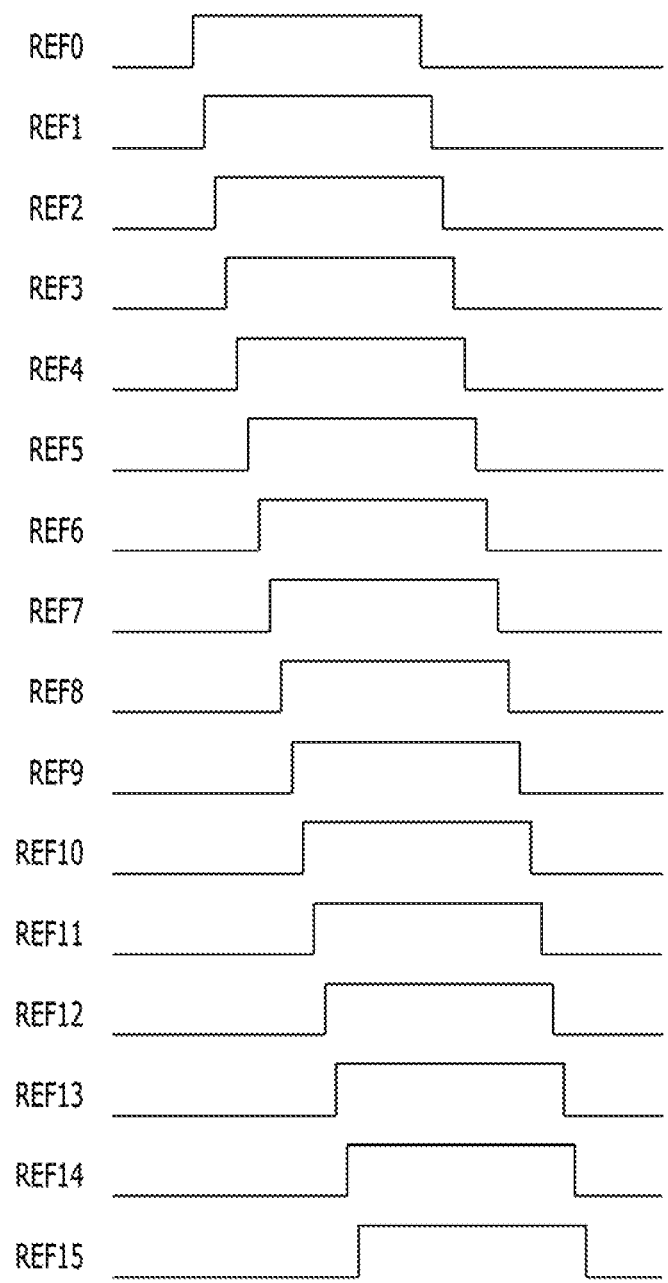

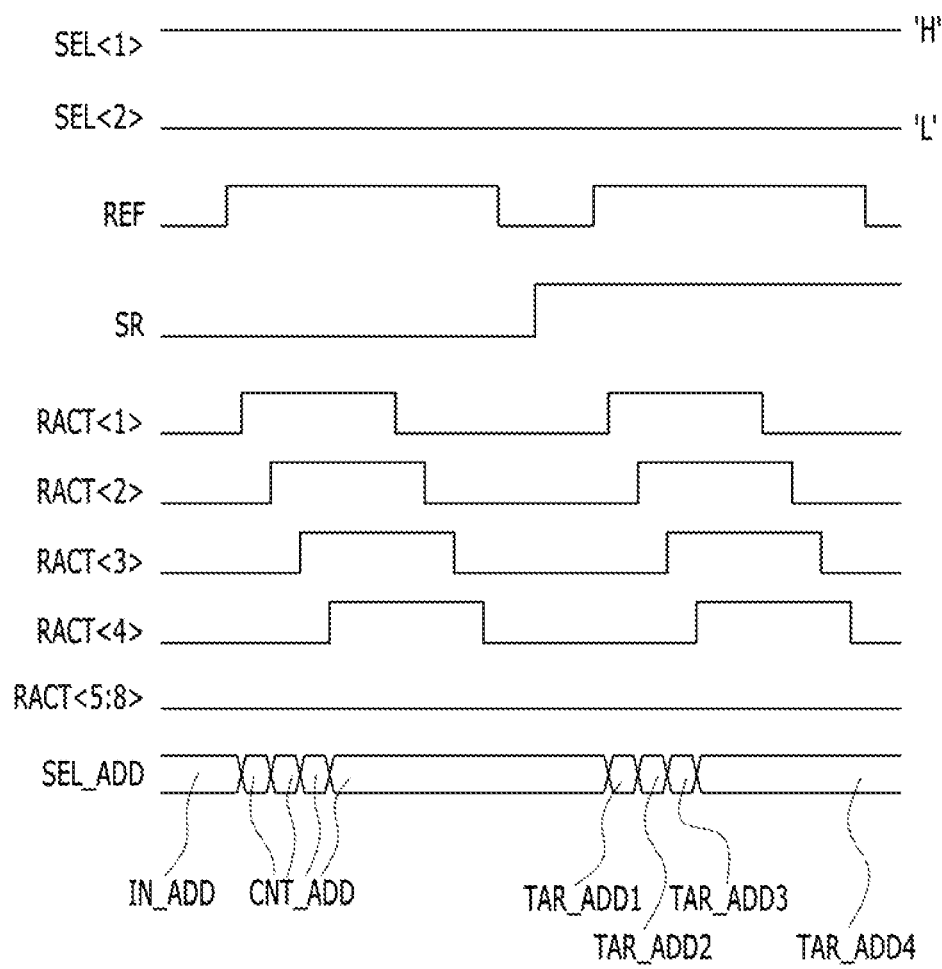

BASE CHIP AND SEMICONDUCTOR PACKAGE INCLUDING THE SAME

CROSS-REFERENCE TO RELATED APPLICATIONS

The present application claims priority of Korean Patent Application No. 10-2015-0181523, filed on Dec. 18, 2015, which is incorporated herein by reference in its entirety.

BACKGROUND

1. Field

Exemplary embodiments of the present invention relate to a base chip and a semiconductor package including the same.

2. Description of the Related Art

A memory cell of a semiconductor memory device includes a transistor serving as a switch and a capacitor for storing an electric charge representing data. More specifically, according to whether or not an electric charge is stored in the capacitor of the memory cell or whether the terminal voltage of the capacitor is high or low, the data is determined to be high (logic 1) or low (logic 0).

In principle, since data is stored as an accumulated electric charge, no power is consumed for maintaining the stored data. However, in practice, an initial charge stored in the capacitor may degrade due to a leakage current caused by the PN junction of a metal oxide semiconductor (MOS) transistor. As a result the data may be lost. In order to prevent such a data loss, the stored data in the memory cell must be read, and the memory cell must be recharged according to the read information, before the data is lost. Such an operation must be periodically repeated to retain the data. The process of recharging the memory cell is commonly known as a refresh operation.

In general, a semiconductor memory device performs a refresh operation by periodically activating a word line, in order to retain data stored in memory cells coupled to the word line. A semiconductor memory device includes a plurality of memory banks each having a plurality of word lines. When all memory banks of the semiconductor memory device simultaneously activate word lines in order to perform a refresh operation, the peak current used in the semiconductor memory device may significantly rise.

FIG. 1 is a diagram illustrating a plurality of memory banks BK0 to BK15 included in a semiconductor memory device. FIGS. 2A to 2C are diagrams for illustrating a piled refresh operation.

Referring to FIG. 1, the memory banks BK0 to BK15 may perform a refresh operation when corresponding refresh signals among a plurality of refresh signals REF0 to REF15 are activated.

Referring to FIG. 2A, the refresh operations of the memory banks BK0 to BK15 included in the semiconductor memory device are performed at the same time. Thus, the peak current used in the semiconductor memory device is very high.

Referring to FIG. 2B, the plurality of memory banks BK0 to BK15 included in the semiconductor memory device is divided into four groups, and refresh operations of the four groups are sequentially performed. Thus, the peak current used in the semiconductor memory device is lowered compared to the case of FIG. 2A.

Referring to FIG. 2C, the plurality of memory banks BK0 to BK15 included in the semiconductor memory device is divided into 16 groups, and refresh operations of the 16 groups are sequentially performed. Thus, the peak current used in the semiconductor memory device is lowered even more compared to the cases of FIGS. 2A and 2B.

FIG. 3 is a diagram illustrating a semiconductor package including a plurality of chips, a base chip BASE and a plurality of core chips CORE0 to CORE3.

Referring to FIG. 3, the plurality of core chips CORE0 to CORE3 each core chip including a plurality of memory banks (not shown) are sequentially stacked over the base chip BASE. The base chip BASE performs communication between the semiconductor package and an external device. The base chip BASE may generate signals for controlling the plurality of core chips CORE0 to CORE3 in response to a command received from the external device, and transmit the generated signals to the respective core chips through a plurality of Through Silicon Vias (TSVs). In this example, the signals for controlling the plurality of core chips CORE0 to CORE3 may include a signal for controlling the above-described refresh operation.

In the semiconductor package, the number of memory banks which must be controlled by the base chip BASE may differ according to the number of stacked core chips. Furthermore, when the number of TSVs is increased to control the memory banks, the area of the chip may be significantly increased.

SUMMARY

Various embodiments are directed to a base chip capable of generating signals for controlling refresh operations of memory banks according to the number of stacked core chips, while reducing the number of the Through Silicon Vias (TSVs) required for transmitting the signals, and a semiconductor package including the same.

In an embodiment, there is provided a base chip including first to Nth delay units coupled in series, where N is a natural number equal to or larger than 2, wherein when the number of stacked chips over the base chip is 1, the base chip is suitable for delaying a refresh signal, and generating first to Xth delayed refresh signals using the first to Xth delay units among the first to Nth delay units, where X is a natural number having a relation of $N>X \geq 1$, and when the number of stacked chips over the base chip is 2, the base chip is suitable for delaying the refresh signal, and generating first to Yth delayed refresh signals using the first to Yth delay units among the first to Nth delay units, where Y is a natural number having a relation of $N \geq Y > X$.

In an embodiment, a semiconductor system may include: a base chip including first to Nth delay units coupled in series where N is a natural number equal to or larger than 2; and one or more first core chips sequentially stacked over the base chip, each core chip including first to Xth banks, and suitable for generating stack information regarding core chips stacked over the base chip based on the first value, wherein when the stack information indicates a first value, the base chip is suitable for delaying a refresh signal, and generating first to Xth delayed refresh signals using the first to Xth delay units among the first to Nth delay units, where X is a natural number having a relation of $N>X \geq 1$, and when the stack information indicates a second value, the base chip is suitable for delaying the refresh signal, and generating first to Yth delayed refresh signals using the first to Yth delay units among the first to Nth delay units, where Y is a natural number having a relation of $N \geq Y > X$.

In an embodiment, a semiconductor package may include: a base chip including a plurality of delay units coupled in series; and one or more core chips sequentially stacked over the base chip, and each including one or more bank, the base chip is suitable for delaying a refresh signal, and generating a plurality of delayed refresh signals, using delay units of which the number is set according to the number of stacked core chips, among the plurality of delay units.

BRIEF DESCRIPTION OF THE DRAWINGS

FIGS. 2A to 2C are diagrams illustrating a conventional piled refresh operation.

FIG. 5A is a timing diagram illustrating the operation of the base chip of FIG. 4, when one core chip is stacked over the base chip.

DETAILED DESCRIPTION

Figure 1:
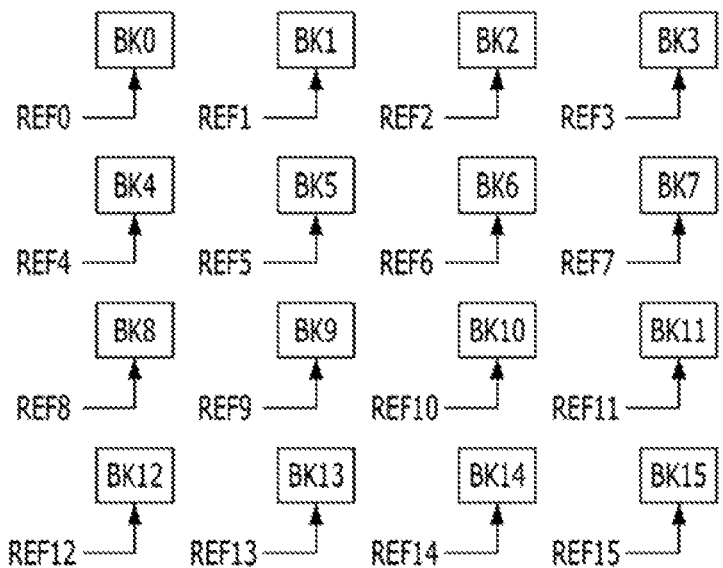
FIG. 1 is a diagram illustrating a plurality of memory banks BK0 to BK15 included in a conventional semiconductor memory device.
Figure 2A:
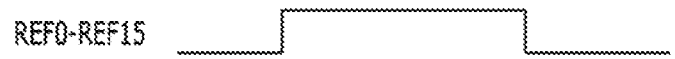
Figure 2B:
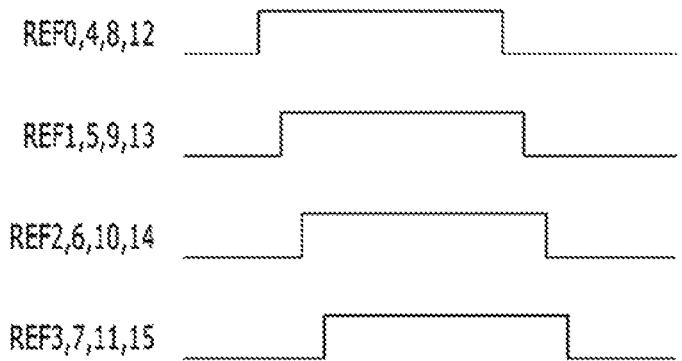
Figure 3:
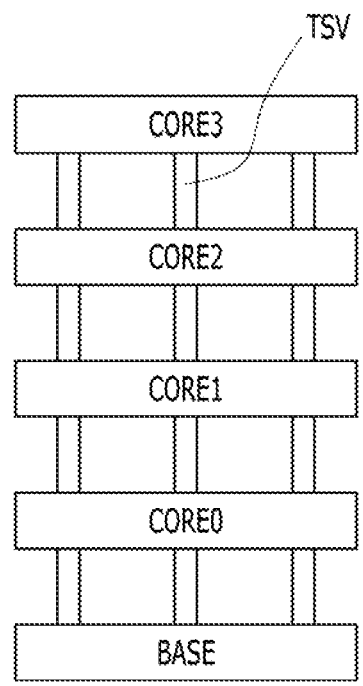
FIG. 3 is a diagram for illustrating a conventional semiconductor package including a plurality of chips BASE and CORE0 to CORE3.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

It will be further understood that when an element is referred to as being "connected to", or "coupled to" another element, it can be directly on, connected to, or coupled to the other element, or one or more intervening elements may be present.

In addition, it will also be understood that when an element is referred to as being "between" two elements, it can be the only element between the two elements, or one or more intervening elements may also be present.

The terminology used herein is for the purpose of describing particular embodiments only and is not intended to be limiting of the present disclosure.

As used herein, the singular forms "a" and "an" are intended to include the plural forms as well, unless the context clearly indicates otherwise.

It will be further understood that the terms "comprises", "comprising", "includes", and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

In the following descriptions, a first refresh operation may indicate a normal refresh operation of sequentially refreshing all word lines (or all memory cells) included in a cell array (memory banks or the like) once during a refresh period tRFC defined in the specification, and a second refresh operation may indicate a smart refresh operation of additionally refreshing a word line one or more times during the refresh period, the word line satisfying a predetermined condition.

Figure 4:
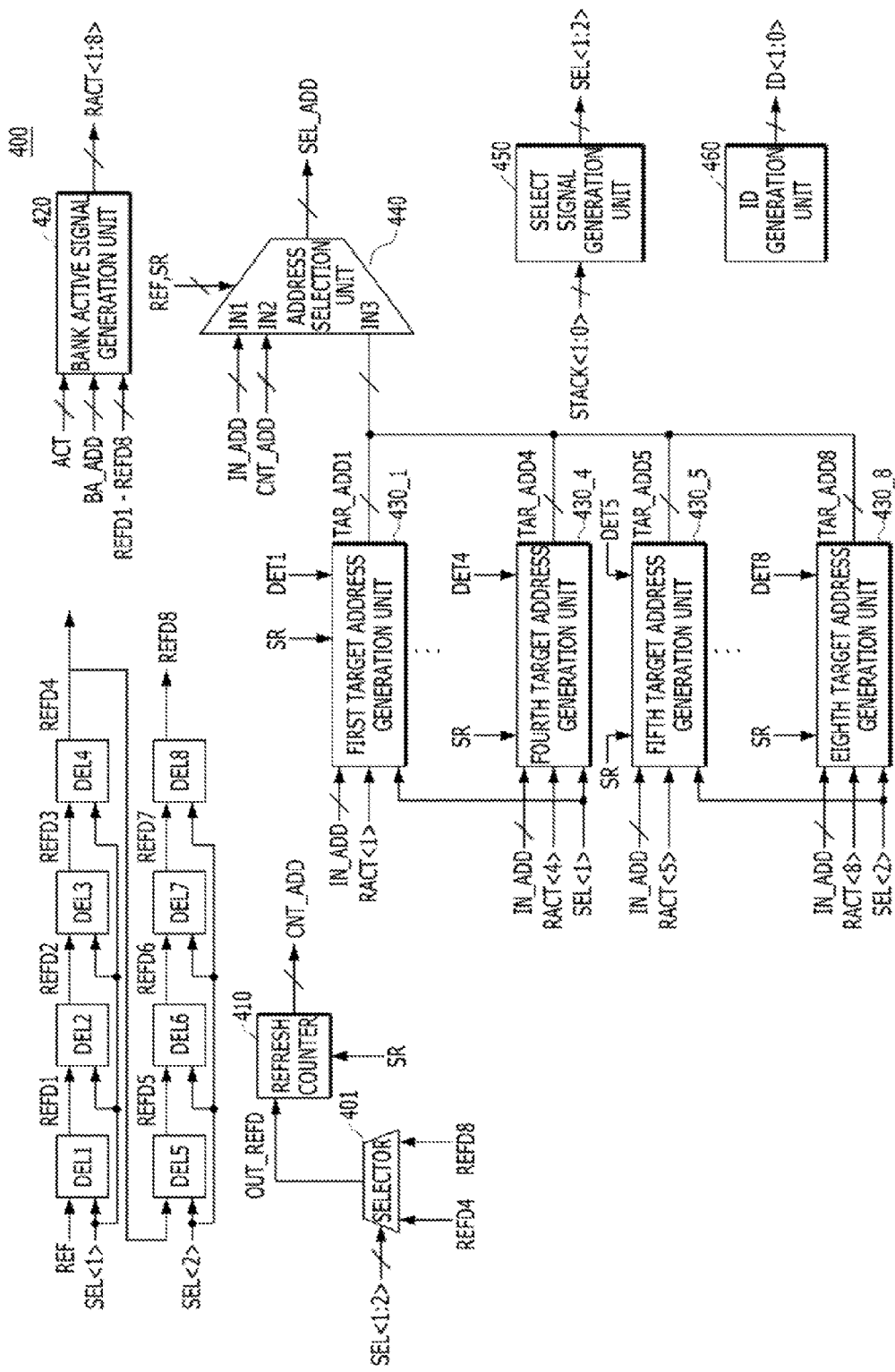
FIG. 4 is a configuration diagram of a base chip according to an embodiment of the present invention.

Referring now to FIG. 4 a base chip according to an embodiment of the present invention is provided.

Accordingly, the base chip is generally designated with numeral 400 and may include first to eighth delay units DEL1 to DEL8, a refresh counter 410, a bank active signal generation unit 420, first to eighth target address generation units 430_1 to 430_8, an address selection unit 440, a select signal generation unit 450, and an identifier (ID) generation unit 460.

The first to eighth delay units DEL1 to DEL8 may be coupled in series. The first delay unit DEL1 may receive a refresh signal REF which is activated when a refresh command is received. The first to fourth delay units DEL1 to DEL4 may be enabled in response to a first select signal SEL<1>, and the fifth to eighth delay units DEL5 to DEL8 may be enabled in response to a second select signal SEL<2>. When one core chip is stacked over the base chip, only the first select signal SEL<1> may be activated. When two core chips are stacked over the base chip, the first and second select signals SEL<1:2> may be activated.

When one core chip is stacked over the base chip, the first to fourth delay units DEL1 to DEL4 may be enabled to generate first to fourth delayed refresh signals REFD1 to REFD4 by delaying the refresh signal REF by different delay values. When two core chips are stacked over the base chip, the first to eighth delay units DEL1 to DEL8 may be enabled to generate first to eighth delayed refresh signals REFD1 to REFD8 by delaying the refresh signal REF by different delay values.

The refresh counter 410 may generate a counting address CNT_ADD by performing counting in response to the delayed refresh signal REFD4 or REFD8 which is finally activated among the plurality of delayed refresh signals REFD1 to REFD8. When only the first select signal SEL<1> of the first and second select signals SEL<1:2> is activated, a selector 401 may select the fourth delayed refresh signal REFD4 between the fourth and eighth delayed refresh signals REFD4 and REFD8, and output the selected refresh signal REFD4 as an output refresh signal OUT_REFD. When both of the first and second signals SEL<1:2> are activated, the selector 401 may select the eighth delayed refresh signal REFD8 between the fourth and eighth delayed refresh signals REFD4 and REFD8, and output the selected refresh signal REFD8 as an output refresh signal OUT_REFD.

The refresh counter 410 may perform counting in response to the output refresh signal OUT_REFD of the selector 401, and increase the value of the counting address CNT_ADD by 1. When the value of the counting address CNT_ADD is increased by 1, it may indicate that, currently, the counting address CNT_ADD is changed to select a (K+1)th word line (e.g., at a (T+1) time) in case where the Kth word line was selected previously (e.g., at a (T) time). When a second refresh signal SR which is activated during the second refresh operation is activated, the refresh counter 410 may not perform counting even though the output refresh signal OUT_REFD of the selector 401 is activated.

The bank active signal generation unit 420 may generate a plurality of bank active signals RACT<1:8> for controlling active operations of a plurality of banks. The bank active signal generation unit 420 may activate a bank active signal corresponding to a bank address BA_ADD when an active command ACT is activated. The bank active signal generation unit 420 may activate a bank active signal corresponding to an activated delayed refresh signal among the first to eighth delayed refresh signals REFD1 to REFD8, during a predetermined period. The first to eighth delayed refresh signals REFD1 to REFD8 may correspond to the first to eighth bank active signals RACT<1:8>, respectively.

The first to eighth target address generation units 430_1 to 430_8 may generate corresponding target addresses among first to eighth target addresses TAR_ADD1 to TAR_ADD8. More specifically, when the first select signal SEL<1> and the second refresh signal SR are activated, the first to fourth target address generation units 430_1 to 430_4 may generate and output the first to fourth target addresses TAR_ADD1 to TAR_ADDR4 in response to the corresponding bank active signals among the first to fourth bank active signals RACT<1:4>.

Furthermore, when the second select signal SEL<2> and the second refresh signal SR are activated, the fifth to eighth target address generation units 430_5 to 430_8 may generate and output the fifth to eighth target addresses TAR_ADD5 to TAR_ADDR8 in response to the corresponding bank active signals among the fifth to eighth bank active signals RACT<5:8>.

At this time, the Kth target address generation unit 430_K may output the Kth target address TAR_ADDK at a period between the point of time that the Kth bank active signal RACT<K> is activated and the point of time that the (K+1)th bank active signal RACT<K+1> is activated.

The first to fourth target address generation units 430_1 to 430_4 may store an input address IN_ADD when corresponding detection signals among first to fourth detection signals DET1 to DET4 are activated in case where the first select signal SEL<1> is activated. The fifth to eighth target address generation units 430_5 to 430_8 may store an input address IN_ADD when corresponding detection signals among fifth to eighth detection signals DET5 to DET8 are activated in case where the second select signal SEL<2> is activated. Each of the first to eighth detection signals DET1 to DET8 may be activated when a word line of which the active number or frequency is equal to or more than a reference number or frequency occurs in a corresponding memory bank (e.g., BK0-BK15 in FIG. 1). In order to detect a word line of which the active number or frequency is equal to or more than the reference number or frequency in the memory device, a predetermined algorithm may be used.

The first to eighth target address generation units 430_1 to 430_8 may generate the first to eighth target addresses TAR_ADD1 to TAR_ADD8 by adding or subtracting a predetermined value to or from the stored addresses, respectively. For example, the first to eighth target address generation units 430_1 to 430_8 may generate the first to eighth target addresses TAR_ADD1 to TAR_ADD8 by adding or subtracting 1 to or from the stored addresses, respectively.

During an active operation in which the refresh signal REF is deactivated, the address selection unit 440 may select an input address IN_ADD inputted through a first input terminal IN1 and output the selected input address IN_ADD as the selected address SEL_ADD. During the first refresh operation in which the refresh signal REF is activated and the second refresh signal SR is deactivated, the address selection unit 440 may select a counting address CNT_ADD inputted through a second input terminal IN2, and output the selected counting address CNT_ADD as the selected address SEL_ADD. During the second refresh operation in which the refresh signal REF is activated and the second refresh signal SR is activated, the address selection unit 440 may select a target address inputted through a third input terminal IN3, and output the selected target address as the selected address SEL_ADD. The target address inputted through the third input terminal IN3 may include the first to fourth target addresses TAR_ADD1 to TAR_ADD4 or the first to eighth target addresses TAR_ADD1 to TAR_ADD8.

The select signal generation unit 450 may activate only the first select signal SEL<1> when the value of stack information STACK<1:0> is '01', and activate both of the first and second select signals SEL<1:2> when the value of the stack information STACK<1:0> is '10'. The ID generation unit 460 may generate and output ID information ID<1:0> having a value of '00'.

The base chip of FIG. 4 can supply a proper number of delayed refresh signals by changing the number of delay units which are used according to the number of core chips stacked over the base chip. Thus, the base chip may perform a proper piled refresh operation according to the number of stacked core chips.

FIG. 5A is a timing diagram illustrating the operation of the base chip of FIG. 4, when one core chip is stacked over the base chip.

Referring to FIG. 5A, when one core chip is stacked over the base chip, the first select signal SEL<1> may be maintained in an active state (e.g., high), and the second select signal SEL<2> may be maintained in an inactive state (e.g., low).

When the refresh signal REF is activated in a state where only the first select signal SEL<1> is activated, the first to fourth delayed refresh signals REFD1 to REFD4 may be sequentially activated, and the first to fourth bank active signals RACT<1:4> may be sequentially activated during a predetermined period, in response to the first to fourth delayed refresh signals REFD1 to REFD4.

At this time, when the second refresh signal SR is deactivated, the counting address CNT_ADD may be outputted as the selected address SEL_ADD, while when the second refresh signal SR is activated, the first to fourth target addresses TAR_ADD1 to TAR_ADD4 may be sequentially outputted as the selected address SEL_ADD.

The fifth to eighth delayed refresh signals REFD5 to REFD8, the fifth to eighth bank active signals RACT<5:8>, and the fifth to eighth target addresses TAR_ADD5 to TAR_ADD8 may be maintained in an inactive state.

Figure 5B:
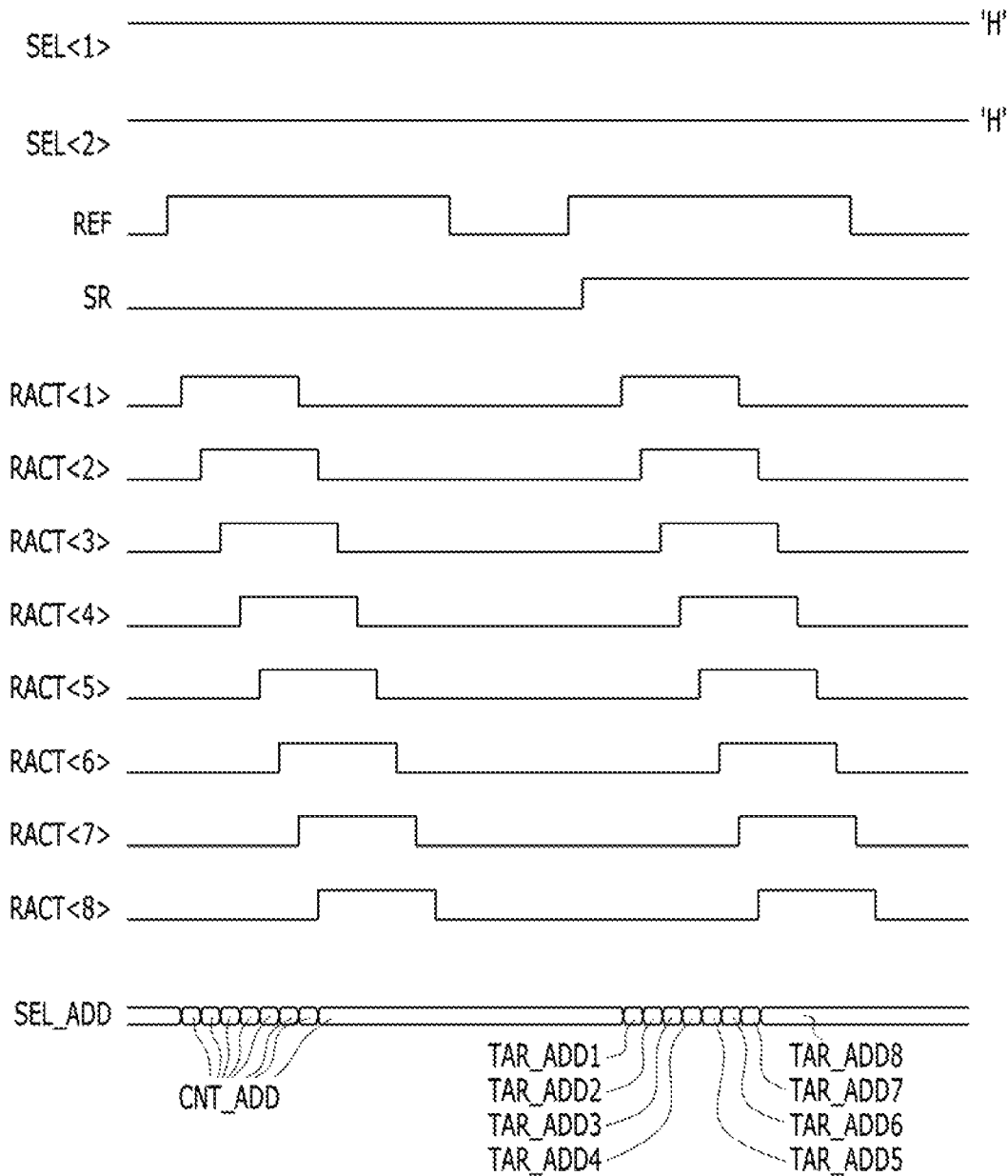
FIG. 5B is a timing diagram illustrating the operation of the base chip of FIG. 4, when two core chips are stacked over the base chip.

FIG. 5B is a timing diagram for illustrating the operation of the base chip of FIG. 4, when two core chips are stacked over the base chip.

Referring to FIG. 5B, when two core chips are stacked over the base chip, the first and second select signals SEL<1:2> may be maintained in an active state (e.g., high).

When the refresh signal REF is activated in a state where the first and second select signals SEL<1:2> are activated, the first to eighth delayed refresh signals REFD1 to REFD8 may be sequentially activated, and the first to eighth bank active signals RACT<1:8> may be sequentially activated during a predetermined period, in response to the first to eighth delayed refresh signals REFD1 to REFD8.

At this time, when the second refresh signal SR is deactivated, the counting address CNT_ADD may be outputted as the selected address SEL_ADD, while when the second refresh signal SR is activated, the first to eighth target addresses TAR_ADD1 to TAR_ADD8 may be sequentially outputted as the selected address SEL_ADD.

Figure 6A:
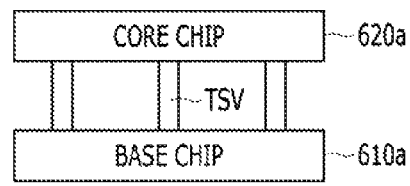
FIG. 6A is a diagram illustrating a semiconductor system according to a first embodiment of the present invention.

FIG. 6A is a diagram for illustrating a semiconductor system according to a first embodiment of the present invention.

Referring to FIG. 6A, the semiconductor system may include a base chip 610a and a core chip 620a stacked over the base chip 610a. The base chip 610a of FIG. 6A may include the base chip described with reference to FIG. 4. The first to fourth bank active signals RACT<1:4>, the first to fourth target addresses TAR_ADD1 to TAR_ADD4, and the chip ID information ID<0:1>, which are generated from the base chip 610a, may be transmitted to the core chip 620a through one or more of a plurality of TSVs. Furthermore, the stack information STACK<1:0> generated from the core chip 620a may be transmitted to the base chip 610a through one or more of the plurality of the TSVs. For reference, the number of TSVs illustrated in FIG. 6A is only an example, and an actual semiconductor system may include a larger number of TSVs than illustrated in FIG. 6A.

Figure 6B:
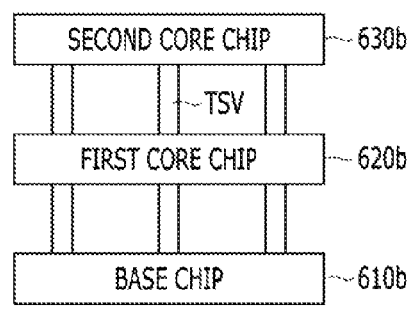
FIG. 6B is a diagram illustrating a semiconductor system according to a second embodiment of the present invention.

FIG. 6B illustrates a semiconductor system according to a second embodiment of the present invention.

Referring to FIG. 6B, the semiconductor system may include a base chip 610b and two core chips 620b and 630b stacked over the base chip 610b. The base chip 610b of FIG. 6B may include the base chip described with reference to FIG. 4.

The first to eighth bank active signals RACT<1:8>, the first to eighth target addresses TAR_ADD1 to TAR_ADD8, and the chip ID information ID<1:0>, which are generated from the base chip 610b, may be transmitted to the first or second core chip 620a or 630a through one or more of a plurality of TSVs. Furthermore, the stack information STACK<1:0> generated from the second core chip 630b may be transmitted to the base chip 610b through one or more of the plurality of TSVs. For reference, the number of TSVs illustrated in FIG. 6B is only an example, and an actual semiconductor system may include a larger number of TSVs than illustrated in FIG. 6B.

Figure 7:
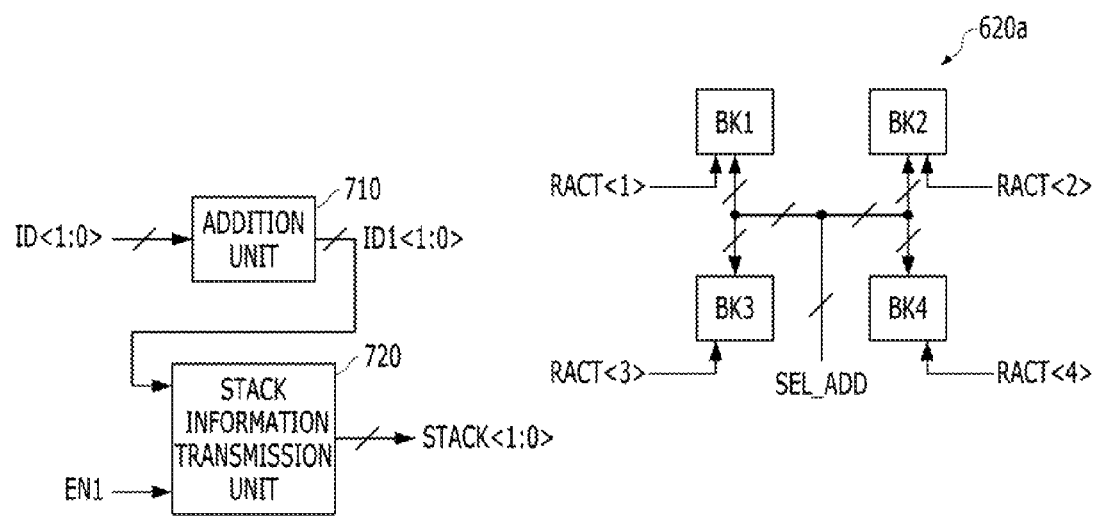
FIG. 7 is a configuration diagram of a core chip shown in FIG. 6A.

FIG. 7 is a configuration diagram of the core chip 620a in FIG. 6A.

Referring to FIG. 7, the core chip 620a may include first to fourth memory banks BK1 to BK4, an addition unit 710, and a stack information transmission unit 720.

The first to fourth memory banks BK1 to BK4 may include a plurality of word lines (not illustrated in FIG. 7), a plurality of bit lines (not illustrated in FIG. 7), and a plurality of memory cells (not illustrated in FIG. 7) coupled between the plurality of word lines and the plurality of bit lines. The first to fourth memory banks BK1 to BK4 may each perform an active operation in response to corresponding bank active signals among the first to fourth bank active signals RACT<1:4>, respectively. The first to fourth memory banks BK1 to BK4 may each activate and precharge a word line corresponding to an address SEL_ADD transmitted from the base chip 610a in response to the bank active signals RACT<1:4>, respectively. For example, in response to a bank active signal RACT<1>, the first memory bank BK1 may activate and precharge a word line corresponding to an address SEL_ADD transmitted from the base chip 610a.

The addition unit 710 may generate a chip ID1<1:0> by adding 1 to the ID information ID<1:0>. Since the value of the ID information ID<1:0> transmitted from the base chip 610a is '00', the chip ID1<1:0> generated from the core chip 620a may have a value of '01'.

When no chips are stacked over the core chip 620a (EN1 is activated), the stack information transmission unit 720 may transmit the chip ID ID1<1:0> as the stack information STACK<1:0> to the base chip 610a. For reference, the first core chip 620b of FIG. 6B may be configured and operated in the same manner as the core chip 620a of FIG. 6A.

Figure 8:
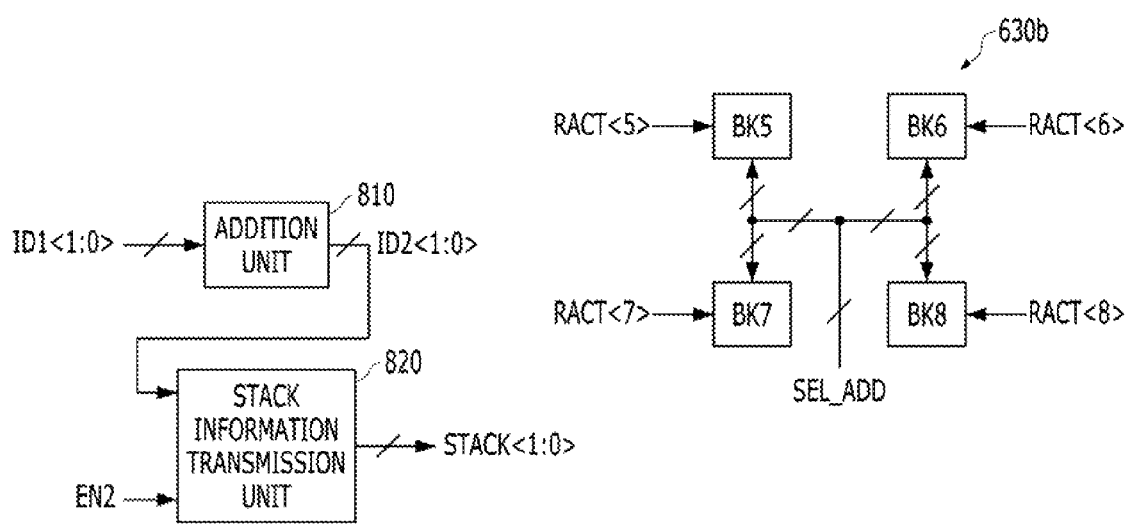
FIG. 8 is a configuration diagram of a second core chip shown in FIG. 6B.

FIG. 8 is a configuration diagram of the second core chip 630b in FIG. 6B.

Referring to FIG. 8, the second core chip 630b may include fifth to eighth memory banks BK5 to BK8, an addition unit 810, and a stack information transmission unit 820.

The fifth to eighth memory banks BK5 to BK8 may each include a plurality of word lines (not illustrated in FIG. 8), a plurality of bit lines (not illustrated in FIG. 8), and a plurality of memory cells (not illustrated in FIG. 8) coupled between the plurality of word lines and the plurality of bit lines. The fifth to eighth memory banks BK5 to BK8 may each perform an active operation in response to corresponding bank active signals among the fifth to eighth bank active signals RACT<5:8>, respectively. The fifth to eighth memory banks BK5 to BK8 may each activate and precharge a word line corresponding to an address SEL_ADD transmitted from the base chip 610b in response to the bank active signals RACT<5:8>, respectively. For example, the fifth memory bank BK5 may activate and precharge a word line corresponding to an address SEL_ADD transmitted from the base chip 610b in response to the bank active signal RACT<5>.

The addition unit 810 may generate a chip ID ID2<1:0> by adding 1 to the chip ID ID1<1:0> transmitted from the first core chip 62b. Since the chip ID ID1<1:0> transmitted from the first core chip 620b has a value of '01', the chip ID ID2<1:0> generated from the second core chip 630b may have a value of '10'.

When no chips are stacked over the core chip 630b (EN2 is activated), the stack information transmission unit 820 may transmit the chip ID ID2<1:0> as the stack information STACK<1:0> to the base chip 610b. For example, when the second core chip 630b is stacked over the first core chip 620b, the enable signal EN1 may be deactivated, and the stack information transmission unit 720 of the first core chip 620b may not output the chip ID ID1<1:0> as the stack information STACK<1:0>.

Referring to FIGS. 6A to 8, a piled refresh may be controlled according to the number of core chips stacked in the semiconductor system. For example, when the number of stacked core chips is 1, a 4-piled refresh may be performed, while when the number of stacked core chips is 2, an 8-piled refresh may be performed. Thus, since the target addresses, which are to be transmitted to the respective memory banks, are outputted (refer to FIGS. 5A and 5B) at separate points of time, all necessary addresses may be transmitted to all of the memory banks, even though there exist only a set of TSVs for transmitting the addresses. Hence, the number of TSVs may be decreased thus reducing the area of each semiconductor chip.

Figure 9:
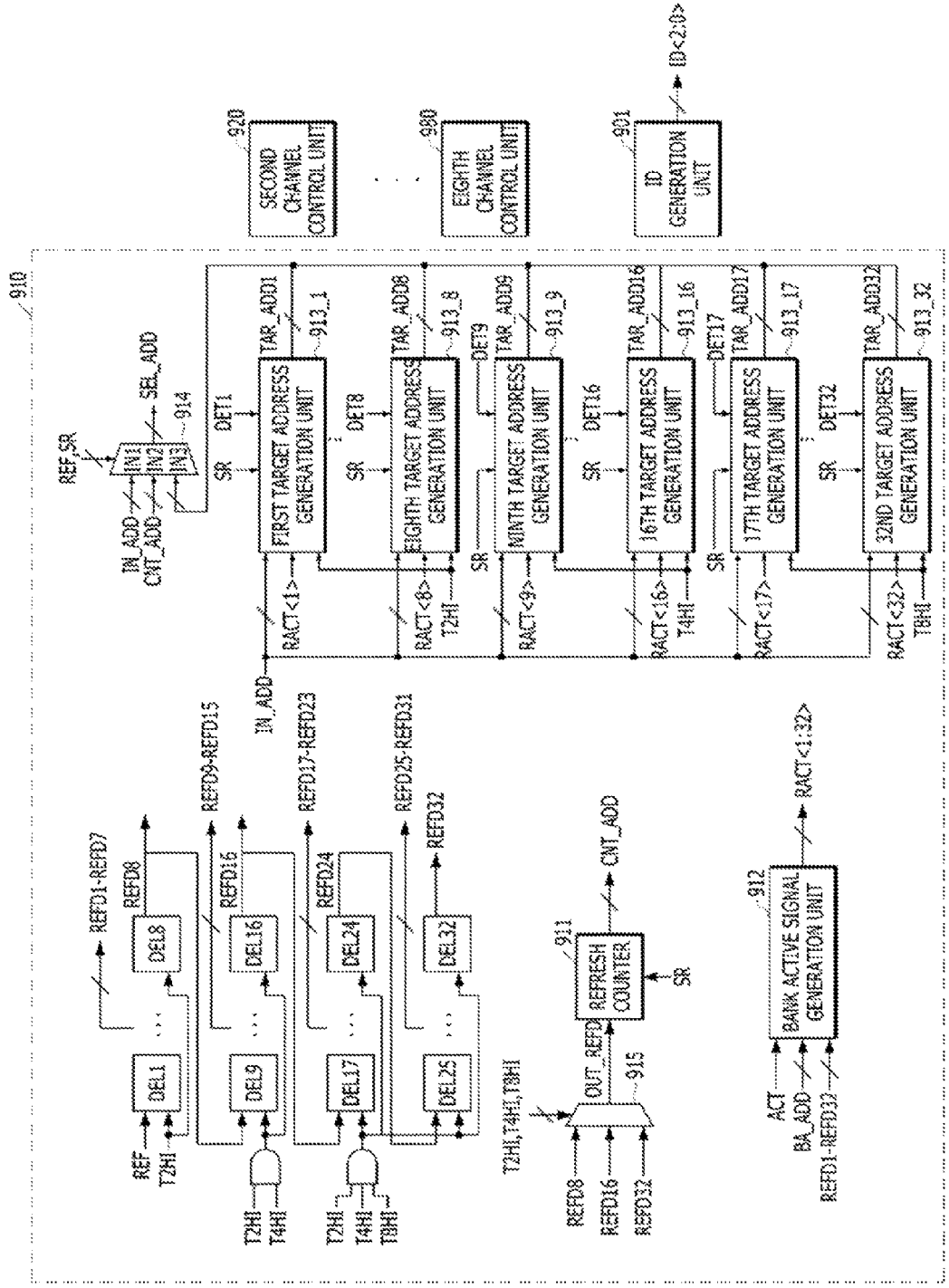
FIG. 9 is a configuration diagram of a base chip according to another embodiment of the present invention.

FIG. 9 is a configuration diagram: of a base chip, according to another embodiment of the present invention.

Referring to FIG. 9, the base chip may include an identifier (ID) generation unit 901 and first to eighth channel control units 910 to 980. The ID generation unit 901 may generate and output ID information ID<2:0> having a value of '000'.

The first channel control unit 910 may include first to 32nd delay units DEL1 to DEL32, a refresh counter 911, a bank active signal generation unit 912, first to 32nd target address generation units 913_1 to 913_32, and an address selection unit 914. The second to eighth channel control units 920 to 980 may have the same configuration as the first channel control unit 910.

The first to 32nd delay units DEL1 to DEL32 may be coupled in series, and the first delay unit DEL1 may receive a refresh signal REF which is activated when a refresh command is received. The first to eighth delay units DEL1 to DEL8 may be enabled when two core chips are stacked over the base chip (i.e., T2HI is activated), the ninth to 16th delay units DEL9 to DEL16 may be enabled when four core chips are stacked over the base chip (i.e., T2HI and T4HI are activated), and the 17th to 32nd delay units DEL17 to DEL32 may be enabled when eight core chips are stacked over the base chip (i.e., T2HI, T4HI, and T8HI are activated).

When two core chips are stacked over the base chip (first embodiment), the first to eighth delay units DEL1 to DEL8 may be enabled to generate first to eighth delayed refresh signals REFD1 to REFD8 by delaying a refresh signal REF by different delay values.

When four core chips are stacked over the base chip (second embodiment), the first to 16th delay units DEL1 to DEL16 may be enabled to generate first to 16th delayed refresh signals REFD1 to REFD16 by delaying the refresh signal REF by different delay values.

When eight core chips are stacked over the base chip (third embodiment), the first to 32nd delay units DEL1 to DEL32 may be enabled to generate first to 32nd delayed refresh signals REFD1 to REFD32 by delaying the refresh signal REF by different delay values.

The refresh counter 911 may generate a counting address CNT_ADD by performing counting in response to the delayed refresh signal REFD8, REFD16, or REFD32 which is finally activated among the plurality of delayed refresh signals. The selector 915 may select and output the eighth delayed refresh signal REFD8 when only T2HI is activated, select and output the 16th delayed refresh signal REFD16 when T2HI and T4HI are activated, and select and output the 32nd refresh signal REFD32 when T2HI, T4HI, and T8HI are activated.

The refresh counter 911 may be configured and operated in the same manner as the refresh counter 410 of FIG. 4.

The bank active signal generation unit 912 may generate a plurality of bank active signals RACT<1:32> for controlling active operations of a plurality of banks. The bank active signal generation unit 912 may activate a bank active signal corresponding to a bank address BA_ADD when an active command ACT is activated. The bank active signal generation unit 912 may activate a bank active signal corresponding to an activated delayed refresh signal among the first to 32nd delayed refresh signals REFD1 to REFD32, during a predetermined period. The first to 32nd delayed refresh signals REFD1 to REFD32 may correspond to the first to 32nd bank active signals RACT<1:32>, respectively.

The first to 32nd target address generation units 913_1 to 913_32 may generate corresponding target addresses among first to 32nd target addresses TAR_ADD1 to TAR_ADD32, when the second refresh signal SR is activated.

More specifically, when T2HI is activated, the first to eighth target address generation units 913_1 to 913_8 may generate and output the first to eighth target addresses TAR_ADD1 to TAR_ADD8 in response to the first to eighth bank active signals RACT<1:8>, respectively. Furthermore, when T4HI is activated, the ninth to 16th target address generation units 913_9 to 913_16 may generate and output the ninth to 16th target addresses TAR_ADD9 to TAR_ADD16 in response to the ninth to 16th bank active signals RACT<9:16>, respectively. Furthermore, when T8HI is activated, the 17th to 32nd target address generation units 913_17 to 913_32 may generate and output the 17th to 32nd target addresses TAR_ADD17 to TAR_ADD32 in response to the 17th to 32nd bank active signals RACT<17:32>, respectively.

For example, a Kth target address generation unit 913_K may output the Kth target address TAR_ADDK between the point of time that the Kth bank active signal RACT<K> is activated and the point of time that the (K+1)th bank active signal RACT<K+1> is activated.

The first to eighth target address generation units 913_1 to 913_8 may store an input address IN_ADD when corresponding detection signals among first to eighth detection signals DET1 to DET8 are activated in case where T2HI is activated. The ninth to 16th target address generation units 913_9 to 913_16 may store an input address IN_ADD when corresponding detection signals among ninth to 16th detection signals DET9 to DET16 are activated in case where T4HI is activated. The 17th to 32nd target address generation units 913_17 to 913_32 may store an input address IN_ADD when corresponding detection signals among 17th to 32nd detection signals DET17 to DET32 are activated in case where T8HI is activated.

The first to 32nd target address generation units 913_1 to 913_32 may generate the first to 32nd target addresses TAR_ADD1 to TAR_ADD32 by adding or subtracting a predetermined value to or from the stored addresses. For example, the first to 32nd target address generation units 913_1 to 913_32 may generate the first to 32nd target addresses TAR_ADD1 to TAR_ADD32 by adding or subtracting 1 to or from the stored addresses.

During an active operation in which the refresh signal REF is deactivated, the address selection unit 914 may select an input address IN_ADD inputted through a first input terminal IN1 and output the selected input address as the selected address SEL_ADD. During the first refresh operation in which the refresh signal REF is activated and the second refresh signal SR is deactivated, the address selection unit 914 may select a counting address CNT_ADD inputted through a second input terminal IN2 and output the select counting address as the selected signal SEL_ADD. During the second refresh operation in which the refresh signal REF is activated and the second refresh signal SR is activated, the address selection unit 914 may select a target address inputted through a third input terminal IN3 and output the selected target address as the selected address. The address inputted through the third input terminal IN3 may include the first to eighth target addresses TAR_ADD1 to TAR_ADD8, the first to 16th target addresses TAR_ADD1 to TAR_ADD16, or the first to 32nd target addresses TAR_ADD1 to TAR_ADD32.

The second to eighth channel control units 920 to 980 may have the same configuration as the first channel control unit 910. Each of the first to eighth channel control units 910 to 980 may independently control the operation of a channel including a plurality of memory banks. The first to eighth channel control units 910 to 980 may be independently operated while exchanging signals such as commands, addresses, and data with the outside of the semiconductor system.

In the above descriptions, T2HI, T4HI, and T8HI represent stack information indicating how many core chips are stacked over the base chip. When two core chips are stacked, T2HI may be activated. When four core chips are stacked, T2HI and T4HI may be activated. When eight core chips are stacked, T2HI, T4HI, and T8HI may be activated.

The base chip of FIG. 9 may supply a proper number of delayed refresh signals by changing the number of delay units which are used according to the number of core chips stacked over the base chip. Thus, the base chip may perform a proper piled refresh operation according to the number of stacked core chips.

FIG. 11A illustrates a semiconductor system including a core chip according to a first embodiment of the present invention.

Figure 10A:
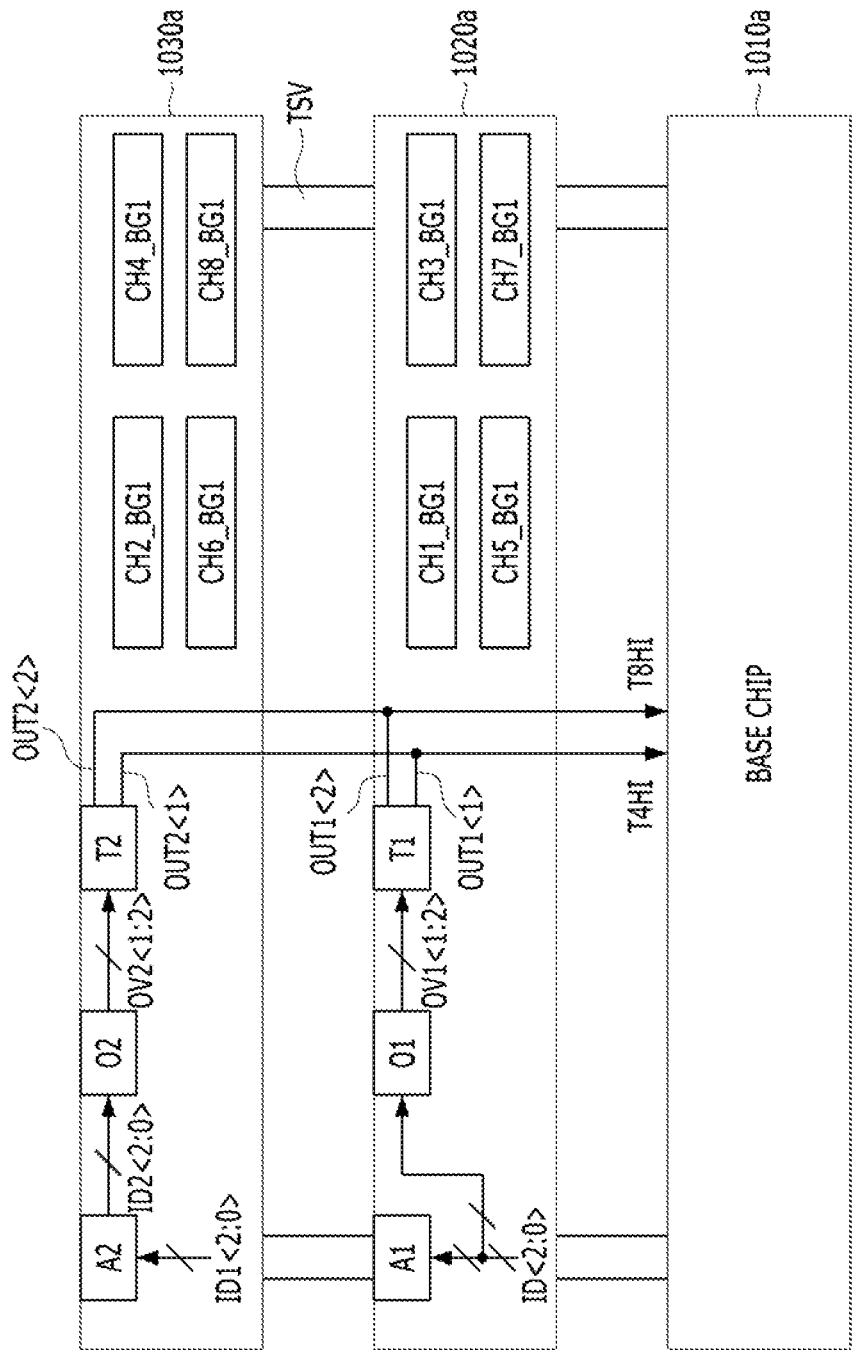
FIG. 10A is a diagram illustrating a semiconductor system including a core chip according to a first embodiment of the present invention.

Referring to FIG. 10A, the semiconductor system may include a base chip 1010a and first and second core chips 1020a and 1030a which are sequentially stacked over the base chip 1010a.

The first core chip 1020a may include bank groups CH1_BG1, CH3_BG1, CH5_BG1, and CH7_BG1 corresponding to first, third, fifth, and seventh channels. The second core chip 1030a may include bank groups CH2_BG1, CH4_BG1, CH6_BG1, and CH8_BG1 corresponding to second, fourth, sixth, and eighth channels. The first core chip 1020a may include an addition units A1, an operation units O1, and a transmission unit T1. The second core chip 1030a may include an addition units A2, an operation units O2, and a transmission unit T2. Hereafter, let us suppose, as an example, that each of the bank groups includes eight memory banks.

The bank groups corresponding to the first to eighth channels may be controlled by the first to eighth channel control units 910 to 980 of the base chip 1010a in FIG. 9, respectively. Hereafter, the operation of the semiconductor system will be described, while focused on the first channel.

The first to eighth bank active signals RACT<1:8> and the first to eighth target addresses TAR_ADD1 to TAR_ADD8, which are generated through the base chip 1010a, may be transmitted to the first core chip 1020a through TSVs. For reference, the number of TSVs illustrated in FIG. 10A is only an example, and an actual semiconductor system may include a larger number of TSVs than illustrated in FIG. 10A.

For reference, a method for generating stack information T4HI and T8HI will be described below with reference to FIG. 10C.

Figure 10B:
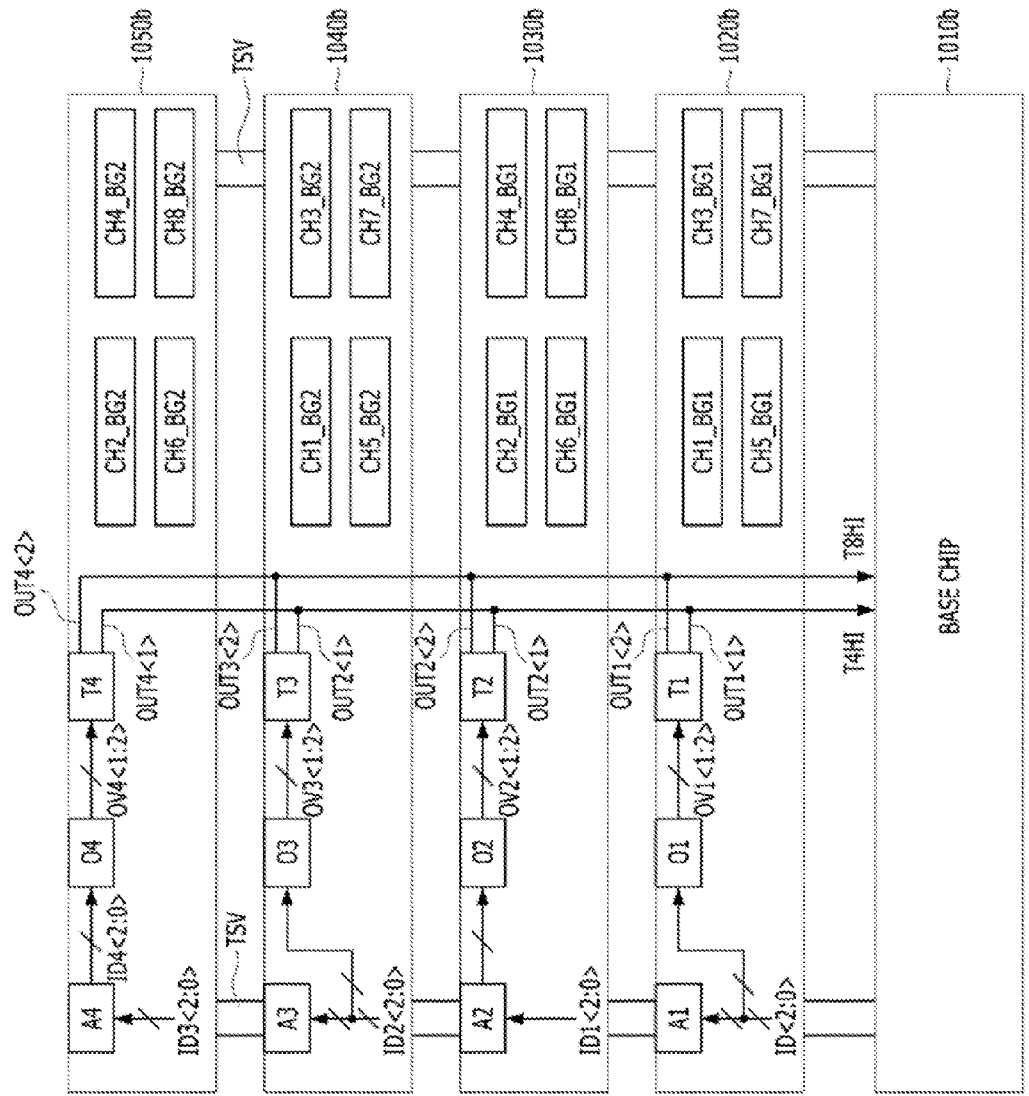
FIG. 10B is a diagram for illustrating a semiconductor system including a core chip according to a second embodiment of the present invention.

FIG. 10B is a diagram for illustrating a semiconductor system including a core chip according to a second embodiment of the present invention.

Referring to FIG. 10B, the semiconductor system may include a base chip 1010b and first to fourth core chips 1020b to 1050b which are sequentially stacked over the base chip 1010b. The first to fourth core chips 1020b to 1050b may include addition units A1 to A4, operation units O1 to O4, and transmission units T1 to T4, respectively.

The first and second core chips 1020b and 1030b may be configured and operated in the same manner as the first and second core chips 1020a and 1030a, respectively.

The third core chip 1040b may include bank groups CH1_BG2, CH3_BG2, CH5_BG2, and CH7_BG2 corresponding to the first, third, fifth, and seventh channels. The fourth core chip 1050b may include bank groups CH2_BG2, CH4_BG2, CH6_BG2, and CH8_BG2 corresponding to the second, fourth, sixth, and eighth channels.

The ninth to 16th bank active signals RACT<9:16> and the ninth to 16th target addresses TAR_ADD9 to TAR_ADD16, which are generated from the base chip 1010b, may be transmitted to the third core chip 1040a through TSVs. For reference, the number of TSVs illustrated in FIG. 10B is only an example, and an actual semiconductor system may include a larger number of TSVs than illustrated in FIG. 10B.

For reference, the method for generating stack information T4HI and T8HI will be described below with reference to FIG. 10C.

Figure 10C:
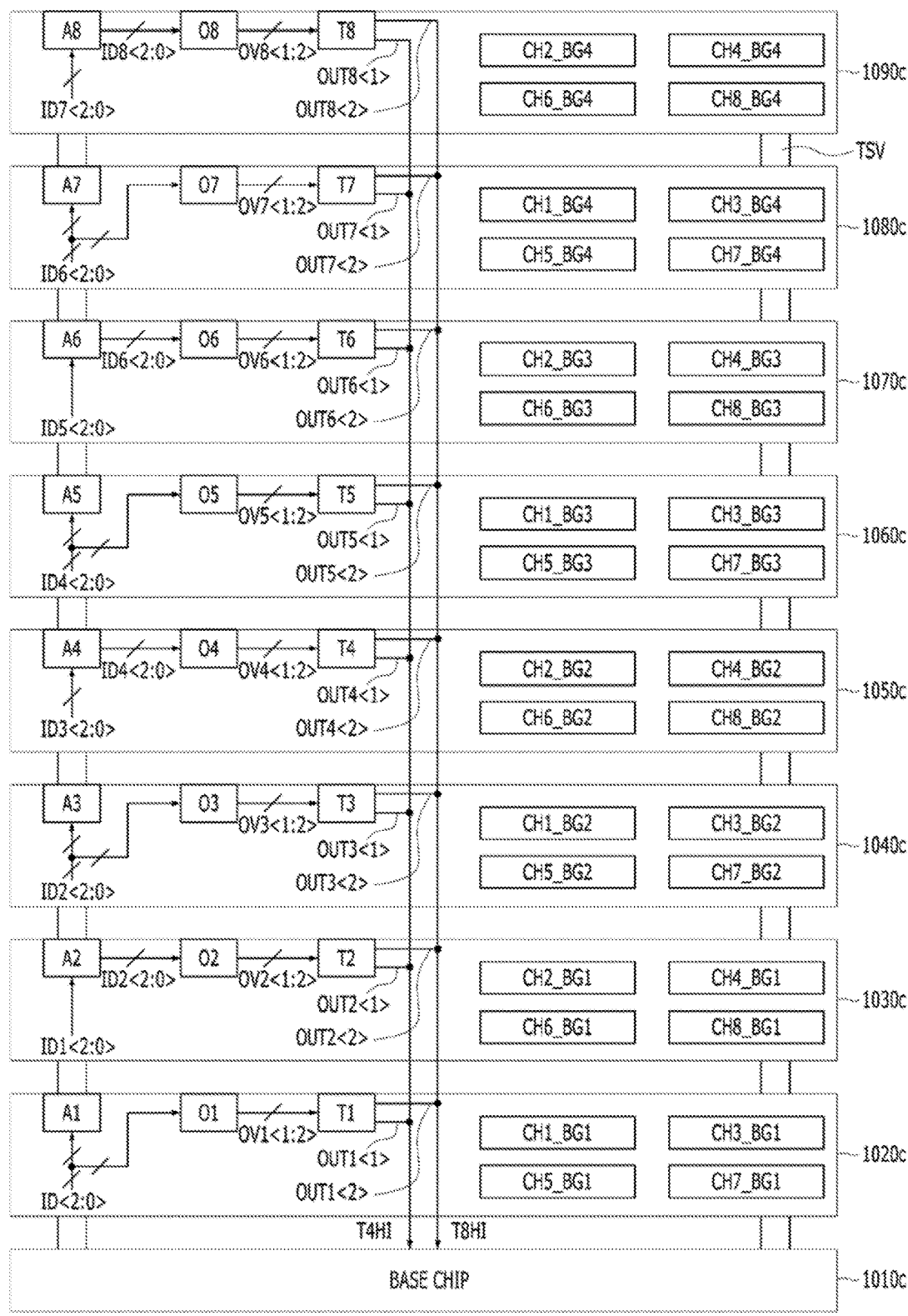
FIG. 10C is a diagram for illustrating a semiconductor system including a core chip according to a third embodiment of the present invention.

FIG. 10C is a diagram for illustrating a semiconductor system including a core chip according to a third embodiment of the present invention.

Referring to FIG. 10C, the semiconductor system may include a base chip 1010c and first to eighth core chips 1020c to 1090c which are sequentially stacked over the base chip 1010c. The first to eighth core chips 1020c and 1090c may include addition units A1 to A8, operation units O1 to O8, and transmission units T1 to T8, respectively.

The first to fourth core chips 1020c to 1050c may be configured and operated in the same manner as the first to fourth core chips 1020b to 1050b, respectively.

The fifth core chip 1060c may include bank groups CH1_BG3, CH3_BG3, CH5_BG3, and CH7_BG3 corresponding to the first, third, fifth, and seventh channels. The sixth core chip 1070c may include bank groups CH2_BG3, CH4_BG3, CH6_BG3, and CH8_BG3 corresponding to the second, fourth, sixth, and eighth channels. The seventh core chip 1080c may include bank groups CH1_BG4, CH3_BG4, CH5_BG4, and CH7_BG4 corresponding to the first, third, fifth, and seventh channels. The eighth core chip 1090c may include bank groups CH2_BG4, CH4_BG4, CH6_BG4, and CH8_BG4 corresponding to the second, fourth, sixth, and eighth channels.

The 17th to 24th bank active signals RACT<17:24> and the 17th to 24th target addresses TAR_ADD17 to TAR_ADD24, which are generated from the base chip 1010c, may be transmitted to the fifth core chip 1060c through TSVs. The 25th to 32nd bank active signals RACT<25:32> and the 25th to 32nd target addresses TAR_ADD25 to TAR_ADD32, which are generated through the base chip 1010c, may be transmitted to the seventh core chip 1080c through TSVs.

It is noted that the number of TSVs illustrated in FIG. 10C is only an example, and an actual semiconductor system may include a larger number of TSVs than illustrated in FIG. 10C.

Hereafter, the method for generating stack information T2HI, T4HI, and T8HI will be described with reference to FIG. 10C.

The first to eighth core chips 1020c and 1090c may include addition units A1 to A8, operation units O1 to O8, and transmission units T1 to T8, respectively. In order that all of the eight channels included in the semiconductor system are used, two or more core chips need to be stacked. Thus, when a packaging process for the semiconductor system is completed, T2HI may be unconditionally activated.

Each of the addition units A1 to A8 may receive ID information ID<2:0>, a chip ID ID1<2:0>, . . . , and ID7<2:0> outputted from the chip stacked under the chip including the corresponding addition unit, and generate the corresponding chip ID by adding 1 to the received ID information or chip ID.

When information inputted to each of the operation units O1 to O8 is IDK<2:0>, a first operation value OV1<1>, . . . , or OV8<1> of the operation unit may be calculated through an equation of OUT<1>=IDK<0>*IDK<1>, and a second operation value OV1<2>, . . . , or OV8<2> of the operation unit may be calculated through an equation of OUT<2>=IDK<0>*IDK<1>*IDK<2>.

The chip information ID<2:0> may be inputted to the operation unit O1, the chip ID ID2<2:0> may be inputted to the operation unit O2, the chip ID ID2<2:0> may be inputted to the operation unit O3, the chip ID ID4<2:0> may be inputted to the operation unit O4, the chip ID ID4<2:0> may be inputted to the operation unit O5, the chip ID ID6<2:0> may be inputted to the operation unit O6, the chip ID ID6<2:0> may be inputted to the operation unit O7, and the chip ID ID8<2:0> may be inputted to the operation unit O8.

Each of the transmission units T1 to T8 may include two tri-state buffers (not illustrated in FIG. 10C). The transmission units T1 to T8 may output first output signals OUT1<1> to OUT8<1> indicating a high-impedance state when the first operation values OV1<1> to OV1<8> are 0, respectively. The transmission units T1 to T8 may output the first output signals OUT1<1> to OUT8<1> at a high level when the first operation values OV1<1> to OV1<8> are 1, respectively. The high-impedance state may indicate a state in which no values are outputted. Furthermore, the transmission units T1 to T8 may output second output signals OUT1<2> to OUT8<2> indicating a high-impedance state when the second operation values OV2<1> to OV2<8> are 0, respectively. The transmission units T1 to T8 may output the second output signals OUT1<2> to OUT8<2> at a high level when the second operation values OV2<1> to OV2<8> are 1, respectively.

In the above-described configuration, when the number of stacked core chips is less than four, T4HI and T8HI may be deactivated (FIG. 10A). When the number of stacked core chips is between 4 and 7, T4HI may be activated, and T8HI may be deactivated (FIG. 10B). When the number of stacked core chips is eight, T4HI and T8HI may be activated (FIG. 10C).

According to an embodiment of the present invention, the base chip and the semiconductor package may adjust the number of signals for controlling refresh according to the number of core chips stacked over the base chip, and sequentially activate the signals, thereby minimizing the number of TSVs for transmitting the signals.

Although various embodiments have been described for illustrative purposes, it will be apparent to those skilled in the art that various changes and modifications may be made without departing from the spirit and/or scope of the invention as defined in the following claims.

What is claimed is:

1. A base chip comprising:
   first to Nth delay units coupled in series, where N is a natural number equal to or larger than 2,
   wherein when the number of stacked chips over the base chip is 1, the base chip is suitable for delaying a refresh signal, and generating first to Xth delayed refresh signals using the first to Xth delay units among the first to Nth delay units, where X is a natural number having a relation of N>X≥1, and
   when the number of stacked chips over the base chip is 2, the base chip is suitable for delaying the refresh signal, and generating first to Yth delayed refresh signals using the first to Yth delay units among the first to Nth delay units, where Y is a natural number having a relation of N≥Y>X.

2. The base chip of claim 1, further comprising a refresh counter suitable for generating a counting address.

3. The base chip of claim 2, further comprising first to Nth target address generation units suitable for generating corresponding target addresses among first to Nth target addresses, when enabled, and
   wherein the first to Nth target address generation units includes:
   the first to Xth target address generation units, which are enabled when the number of stacked chips is 1, and
   the first to Yth target address generation units, which are enabled when the number of stacked chips is 2.

4. The base chip of claim 3, further comprising an address selection unit suitable for selecting the counting address during a first refresh operation, sequentially selecting the first to Xth target addresses during a second refresh operation when the number of stacked chips is 1, and sequentially selecting the first to Yth target addresses during the second refresh operation when the number of stacked chips is 2.

5. A semiconductor package comprising:
   a base chip including first to Nth delay units coupled in series where N is a natural number equal to or larger than 2; and
   one or more first core chips sequentially stacked over the base chip, each core chip including first to Xth banks, and suitable for generating stack information regarding core chips stacked over the base chip based on the first value,
   wherein when the stack information indicates a first value, the base chip is suitable for delaying a refresh signal, and generating first to Xth delayed refresh signals using the first to Xth delay units among the first to Nth delay units, where X is a natural number having a relation of N>X≥1, and when the stack information indicates a second value, the base chip is suitable for delaying the refresh signal, and generating first to Yth delayed refresh signals using the first to Yth delay units among the first to Nth delay units, where Y is a natural number having a relation of N≥Y>X.

6. The semiconductor package of claim 5, wherein the base chip further comprises a refresh counter suitable for generating a counting address.

7. The semiconductor package of claim 6, wherein the base chip further comprises first to Nth target address generation units suitable for generating corresponding target addresses among first to Nth target addresses, when enabled, wherein the first to Nth target address generation units includes:
the first to Xth target address generation units, which are enabled when the stack information is the first value, and
the first to Yth target address generation units, which are enabled when the stack information is the second value.

8. The semiconductor package of claim 7, wherein the base chip further comprises an address selection unit suitable for selecting the counting address during a first refresh operation, sequentially selecting the first to Xth target addresses during a second refresh operation when the stack information is the first value, and sequentially selecting the first to Yth target addresses during the second refresh operation when the stack information is the second value.

9. The semiconductor package of claim 5, wherein the first to Xth banks correspond to the first to Xth delayed refresh signals, respectively, and are refreshed in response to the corresponding delayed refresh signals among the first to Xth delayed refresh signals.

10. The semiconductor package of claim 9, wherein during the first refresh operation, memory cells selected by the counting address in the first to Xth banks are refreshed, and
during the second refresh operation, memory cells selected by the corresponding target addresses among the first to Xth target addresses in the first to Xth banks are refreshed.

11. The semiconductor package of claim 5, further comprising one or more second core chips sequentially stacked over the first core chip, comprising (X+1)th to Yth banks, and suitable for generating the stack information based on the second value.

12. The semiconductor package of claim 11, wherein the first to Yth banks correspond to the first to Yth delayed refresh signals, respectively, and are refreshed in response to the corresponding delayed refresh signals among the first to Yth refresh signals.

13. The semiconductor package of claim 12, wherein during the first refresh operation, memory cells selected by the counting address in the first to Yth banks are refreshed, and
during the second refresh operation, memory cells selected by the corresponding target addresses among the first to Yth target addresses in the first to Yth banks are refreshed.

14. A semiconductor package comprising:
a base chip including a plurality of delay units coupled in series; and
one or more core chips sequentially stacked over the base chip, and each including one or more bank,
the base chip is suitable for delaying a refresh signal, and generating a plurality of delayed refresh signals, using delay units of which the number is set according to the number of stacked core chips, among the plurality of delay units.

15. The semiconductor package of claim 14, wherein the one or more core chips generate stack information having a value corresponding to the number of stacked core chips, and
the base chip generates the plurality of delayed refresh signals using delay units of which the number corresponds to the value of the stack information, among the plurality of delay units.

16. The semiconductor package of claim 14, wherein the number of delay units used for generating the plurality of delayed refresh signals is increased as the number of stacked core chips is increased.

17. The semiconductor package of claim 14, wherein the one or more banks of the one or more core chips are refreshed in response to the corresponding delayed refresh signals among the plurality of delayed refresh signals.

18. The semiconductor package of claim 14, wherein the one or more core chips generate stack information having a value corresponding to the number of stacked core chips, and
the base chip generates the plurality of delayed refresh signals using delay units of which the number corresponds to the value of the stack information, among the plurality of delay units.

19. The semiconductor package of claim 18, wherein the base chip further comprises a refresh counter suitable for a counting address.

20. The semiconductor package of claim 19, wherein the base chip comprises a plurality of target address generation units suitable for generating a target address when enabled, and enables target address generation units of which the number is set according to the value of the stack information, among the plurality of target address generation units.

21. The semiconductor package of claim 20, wherein the base chip further comprises an address selection unit suitable for selecting the counting address during a first refresh operation, and sequentially selecting target addresses generated by enabled target address generation units among the plurality of target address generation units during a second refresh operation.

* * * * *